United States Patent
Bhardwaj et al.

(10) Patent No.: US 8,598,849 B2
(45) Date of Patent: Dec. 3, 2013

(54) IN-SITU BATTERY HEALTH DETECTOR AND END-OF-LIFE INDICATOR

(71) Applicant: Apple Inc., Cupertino, CA (US)

(72) Inventors: Ramesh C. Bhardwaj, Fremont, CA (US); Taisup Hwang, Santa Clara, CA (US); Richard M. Mank, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/785,972

(22) Filed: Mar. 5, 2013

(65) Prior Publication Data

US 2013/0241494 A1    Sep. 19, 2013

Related U.S. Application Data

(62) Division of application No. 12/581,721, filed on Oct. 19, 2009, now Pat. No. 8,415,926.

(51) Int. Cl.
*H02J 7/00* (2006.01)
*H02J 7/04* (2006.01)

(52) U.S. Cl.
USPC ........... 320/134; 320/136; 320/129; 320/139; 320/148; 320/161

(58) Field of Classification Search
USPC ......... 320/134, 135, 136, 132, 127, 128, 129, 320/137, 139, 148, 149, 156, 157, 161, 162, 320/164; 324/425, 426, 427, 428, 429, 430, 324/431, 432, 434, 435, 436
See application file for complete search history.

(56) References Cited

U.S. PATENT DOCUMENTS

| | | | |
|---|---|---|---|
| 5,705,929 A * | 1/1998 | Caravello et al. | 324/430 |
| 6,166,524 A * | 12/2000 | Takeuchi et al. | 320/132 |
| 6,232,750 B1 * | 5/2001 | Podrazhansky et al. | 320/139 |
| 6,384,576 B1 * | 5/2002 | Jokinen | 320/122 |
| 7,714,736 B2 * | 5/2010 | Gielniak | 340/636.1 |
| 7,788,052 B2 * | 8/2010 | Iwane et al. | 702/63 |
| 2005/0088145 A1 * | 4/2005 | Loch | 320/132 |
| 2006/0033473 A1 * | 2/2006 | Stanzel et al. | 320/128 |
| 2008/0265840 A1 * | 10/2008 | De Paula et al. | 320/132 |
| 2008/0272790 A1 * | 11/2008 | Atehortua et al. | 324/427 |
| 2009/0295397 A1 * | 12/2009 | Barsukov | 324/429 |

* cited by examiner

*Primary Examiner* — Edward Tso
*Assistant Examiner* — Alexis Boateng
(74) *Attorney, Agent, or Firm* — Park, Vaughan, Fleming & Dowler LLP; Anthony P. Jones (57) ABSTRACT

Some embodiments provide a system that monitors a battery in a portable electronic device. During operation, the system applies a pulse load to the battery and determines an impedance of the battery by measuring a voltage of the battery during the pulse load. Next, the system assesses a health of the battery based on the impedance. Finally, the system uses the assessed health to manage use of the battery in the portable electronic device.

12 Claims, 5 Drawing Sheets

IN-SITU BATTERY HEALTH DETECTOR AND END-OF-LIFE INDICATOR

RELATED CASES

This application is a divisional application of, and hereby claims priority under 35 U.S.C. §120 to, pending U.S. patent application Ser. No. 12/581,721, which is titled "In-Situ Battery Health Detector and End-of-Life Indicator," by Ramesh C. Bhardwaj, Taisup Hwang, and Richard M. Mank, which was filed on 19 Oct. 2009, and which is incorporated by reference.

BACKGROUND

1. Field

The present embodiments relate to batteries for portable electronic devices. More specifically, the present embodiments relate to in-situ battery health detectors and end-of-life-indicators within portable electronic devices.

2. Related Art

Portable electronic devices, such as laptop computers, portable media players, and/or mobile phones, typically operate using a battery. Furthermore, high-energy battery designs for portable devices often include battery packs that contain battery cells connected together in various series and parallel configurations. For example, a six-cell battery pack of lithium cells may be configured in a three in series, two in parallel (3s2p) configuration. If a single cell can provide a maximum of 3 amps with a voltage ranging from 2.7 volts to 4.2 volts, then the battery pack may have a voltage range of 8.1 volts to 12.6 volts and provide 6 amps of current. The charge in such batteries may be managed by a circuit board, which is commonly known as a protection circuit module (PCM) and/or battery management unit (BMU).

However, once a battery is created, the battery's capacity may diminish over time from use, age, lack of maintenance, damage, and/or manufacturing defects. For example, oxidation of electrolyte and/or degradation of cathode and anode material within a battery may be caused by repeated charge cycles and/or age, which in turn may cause a gradual reduction in the battery's capacity. As the battery continues to age and degrade, the capacity's rate of reduction may increase. Once the battery reaches 80% of initial capacity, the battery's useful life may be expended.

Subsequent use of a battery beyond the battery's end-of-life may cause swelling of the battery's cells and may potentially damage the device powered by the battery, while providing little charge to the device. However, conventional battery-monitoring mechanisms may only provide a rough estimate of the battery's state-of-charge and may not include functionality to assess the battery's health. As a result, a user of the battery may not be aware of the battery's age and/or degradation and may continue using the battery beyond the battery's end-of-life.

Hence, what is needed is a mechanism for assessing battery health and end-of-life and managing battery use based on the assessed health.

SUMMARY

Some embodiments provide a system that monitors a battery in a portable electronic device. During operation, the system applies a pulse load to the battery and determines an impedance of the battery by measuring a voltage of the battery during the pulse load. Next, the system assesses a health of the battery based on the impedance. Finally, the system uses the assessed health to manage use of the battery in the portable electronic device.

In some embodiments, determining the impedance of the battery involves:
  (i) measuring the voltage of the battery in a fully charged state;
  (ii) calculating a drop in the voltage after the pulse load is applied; and
  (iii) dividing the drop in the voltage by a current of the pulse load.

In some embodiments, assessing the health of the battery based on the impedance involves monitoring a change in the impedance over time to detect degradation in the battery.

In some embodiments, monitoring the change in impedance over time involves analyzing a linearity of the impedance as a function of a number of charge-discharge cycles performed on the battery.

In some embodiments, a lack of linearity corresponds to degradation in the battery.

In some embodiments, using the assessed health to manage use of the battery in the portable electronic device involves at least one of adjusting a charge voltage for the battery, notifying a user of the portable electronic device of an end-of-life for the battery, and isolating a cell in the battery.

In some embodiments, adjusting the charge voltage for the battery involves decreasing the charge voltage to extend a cycle life of the battery and to control cell swelling within the battery.

In some embodiments, adjusting the charge voltage for the battery involves stopping charging of the battery at the end-of-life for the battery.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Embodiments provide a method and system for monitoring a battery in a portable electronic device. The battery may include one or more cells in a parallel and/or series configuration and supply power to a mobile phone, laptop computer, portable media player, and/or peripheral device. In addition, the battery may be reused up to a number of charge cycles before losing enough capacity to reach an end-of-life.

More specifically, embodiments provide an in-situ method and system for assessing the health of the battery and determining the end-of-life for the battery. The battery's health may be assessed by monitoring the battery's impedance as charge cycles are performed on the battery. The impedance may be calculated by measuring the battery's voltage during application of a pulse load to the battery, calculating the drop in voltage after the pulse load is applied, and dividing the drop in voltage by the current of the pulse load. As a new battery is used and recharged, the impedance may increase linearly as a function of the number of charge-discharge cycles performed on the battery. However, a lack of linearity in the change in impedance may indicate degradation, damage, defects, and/or the end-of-life for the battery. For example, an initial lack of linearity (e.g., an inflection point) in the change in impedance may represent the onset of degradation in the battery, while subsequent nonlinear increases in the impedance may represent the battery's end-of-life.

The assessed health of the battery may then be used to manage use of the battery in the portable electronic device. For example, the assessed health may be used to adjust a charge voltage for the battery (e.g., to extend the battery's cycle life at the onset of degradation, control cell swelling within the battery, and/or terminate use of the battery at the end-of-life), notify a user of the portable electronic device of the battery's end-of-life, and/or isolate a cell in the battery (e.g., from damage or defects). Consequently, embodiments may both extend the useful life of the battery and prevent continued use of the battery beyond the end-of-life.

Figure 1:
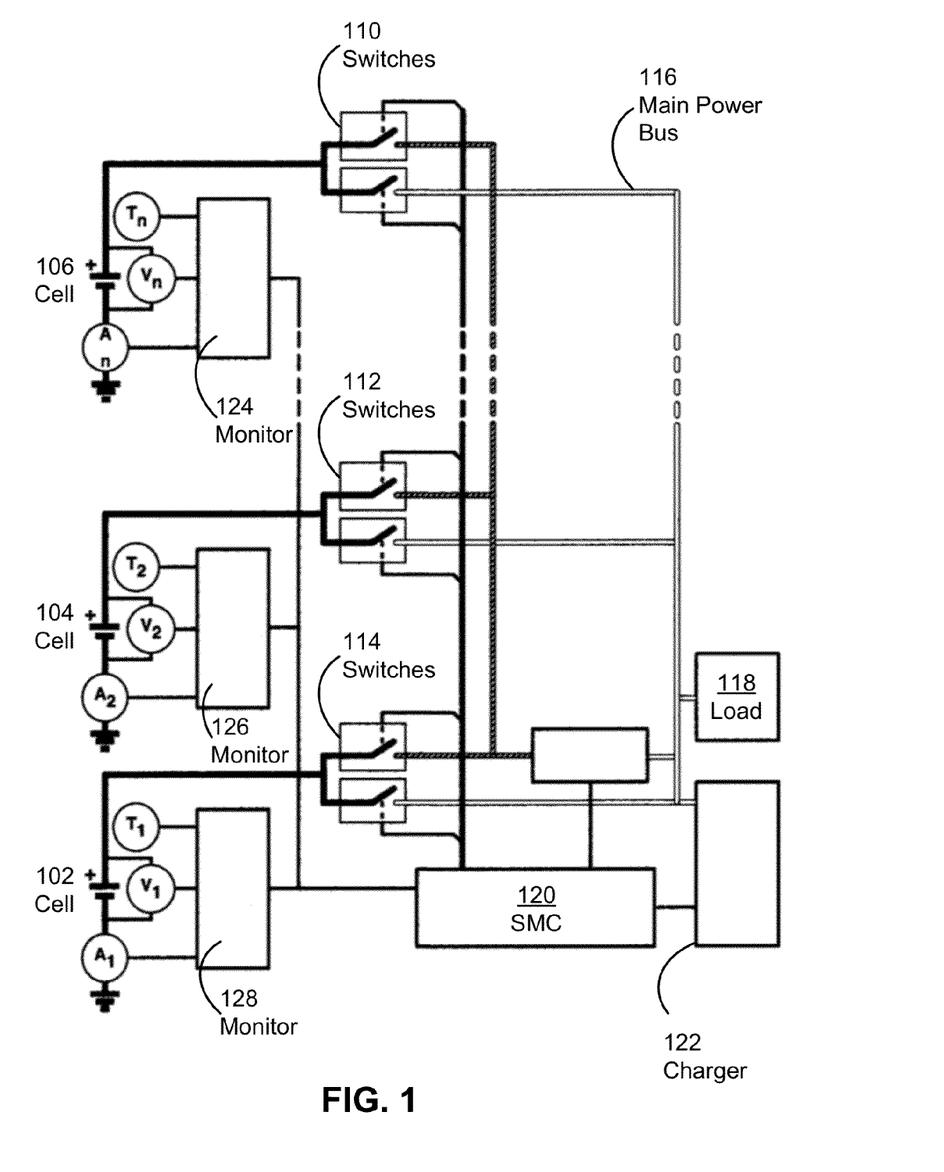
FIG. 1 shows a schematic of a system in accordance with an embodiment.

FIG. 1 shows a schematic of a system in accordance with an embodiment. The system may provide a power source to a portable electronic device, such as a mobile phone, personal digital assistant (PDA), laptop computer, portable media player, and/or peripheral device. In other words, the system may correspond to a battery that supplies power to a load 118 from one or more components (e.g., processors, peripheral devices, backlights, etc.) within the portable electronic device. As shown in FIG. 1, the system includes a number of cells 102-106, a set of switches 110-114, a main power bus 116, a system microcontroller (SMC) 120, and a set of monitors 124-128.

In one or more embodiments, cells 102-106 are connected in a parallel configuration with one another using main power bus 116. Each cell 102-106 may include a sense resistor (not shown) that measures the cell's current. Furthermore, the voltage and temperature of each cell 102-106 may be measured with a thermistor (not shown), which may further allow a battery "gas gauge" mechanism to determine the cell's state-of-charge, impedance, capacity, charging voltage, and/or remaining charge. Measurements of voltage, current, temperature, and/or other parameters associated with each cell 102-106 may be collected by a corresponding monitor 124-128. Alternatively, one monitoring apparatus may be used to collect sensor data from multiple cells 102-106 in the battery.

Data collected by monitors 124-128 may then be used by SMC 120 to assess the state of charge, capacity, and/or health of cells 102-106. SMC 120 may also use the data to manage use of the battery in the portable electronic device. For example, SMC 120 may correspond to a management apparatus that uses the state of charge of each cell 102-106 to adjust the charging and/or discharging of the cell by connecting or disconnecting the cell to main power bus 116 using a set of switches 110-114. Fully discharged cells may be disconnected from main power bus 116 during discharging of the battery to enable cells with additional charge to continue to supply power to load 118. Along the same lines, fully charged cells may be disconnected from main power bus 116 during charging of the battery to allow other cells to continue charging.

Those skilled in the art will appreciate that reductions in battery capacity may result from factors such as age, use, defects, and/or damage. Furthermore, a decrease in battery capacity beyond a certain threshold (e.g., below 80% of initial capacity) may result in swelling of the battery, which may damage the portable electronic device, while providing little useful charge to the portable electronic device. In other words, the battery may reach an end-of-life once the battery's capacity drops below the threshold and may require replacement and/or discontinuation of use.

In one or more embodiments, the system of FIG. 1 corresponds to an in-situ system for determining the battery's end-of-life through periodic assessment of the battery's health. For example, the system of FIG. 1 may be implemented by one or more components of the portable electronic device connected to the battery. To assess the battery's health, monitors 124-128 may measure the voltage of cells 102-106 in a fully charged state and continue measuring while a pulse load is applied to the battery (e.g., from one or more components, charger 122, and/or a dedicated load-generating apparatus or circuit). In one or more embodiments, the length of the pulse load is inversely proportional to the magnitude of the pulse load. For example, a pulse load of 10 amps may be applied to the battery for 0.5 seconds, while a pulse load of 0.5 amps may be applied to the battery for 10 seconds.

Monitors 124-128 may additionally determine the impedance of cells 102-106 using the measured voltage. In particular, the impedance of a cell may be obtained by calculating the drop in voltage for the cell after the pulse load is applied and dividing the drop in voltage by the current of the pulse load. For example, a drop in voltage of 0.2 volts from a pulse load of 4 amps may correspond to an impedance of 0.05 ohms.

Voltage measurements and impedance calculations are discussed in further detail below with respect to FIG. 2A.

Moreover, SMC 120 may monitor the change in impedance over time to detect degradation in cells 102-106 and/or the battery in general. As the battery is used or ages, the impedance may increase linearly until the battery reaches a certain number of charge-discharge cycles, after which the impedance may encounter an inflection point and increase linearly at a higher rate. For example, the impedance may increase at a rate of roughly 25 μohms per charge-discharge cycle for the first 200 charge cycles, then at a much higher rate of 200 μohms per charge-discharge cycle for the next 100 charge-discharge cycles. As a result, an inflection point in the change in impedance may be found at around the $200^{th}$ charge-discharge cycle.

The change in impedance may also increase nonlinearly as the battery reaches the end-of-life. For example, the battery's impedance may increase sharply at around the $300^{th}$ charge-discharge cycle and fluctuate nonlinearly beyond the $300^{th}$ charge-discharge cycle. As a result, SMC 120 may detect degradation in the battery by analyzing the linearity of the impedance as a function of the number of charge-discharge cycles performed on the battery. An initial lack of linearity may indicate degradation in the battery, while subsequent nonlinear changes to the impedance may represent the battery's end-of-life. Impedance analysis and linearity is discussed in further detail below with respect to FIG. 2B.

SMC 120 may further use the assessed health of the battery to manage use of the battery in the portable electronic device. If degradation in the battery is found, SMC 120 may reduce the battery's charge voltage to decrease the rate of cell oxidation in the battery and extend the battery's cycle life, as well as to control cell swelling within the battery. If the battery's end-of-life is reached, SMC 120 may notify the user to prevent continued use of the battery and damage to the portable electronic device. For example, SMC 120 may illuminate a light-emitting diode (LED) on the portable electronic device to notify the user of the end-of-life, or SMC 120 may provide the notification through a user interface and/or display screen of the portable electronic device. SMC 120 may also stop charging the battery if all cells 102-106 have impedances that indicate end-of-life. On the other hand, SMC 120 may isolate individual cells 102-106 in the battery if the cells are defective or damaged and/or have reached the threshold for end-of-life earlier than other cells in the battery. For example, SMC 120 may disconnect cell 102 from main power bus 116 using switches 114 to prevent continued use of cell 102 in the battery if cell 102 has reached 80% of initial capacity before cells 104-106.

Those skilled in the art will appreciate that the functionality of SMC 120 and/or monitors 124-128 may be implemented in multiple ways. For example, SMC 120 and monitors 124-128 may be implemented using one or more hardware modules (e.g., integrated circuits) in the portable electronic device. Similarly, a portion of the functionality of SMC 120 and/or monitors 124-128 may be implemented in software that executes on a processor of the portable electronic device. In other words, the monitoring and management of cells 102-106 in the battery may be conducted by different combinations of in-situ hardware and/or software components on the portable electronic device.

Figure 2A:
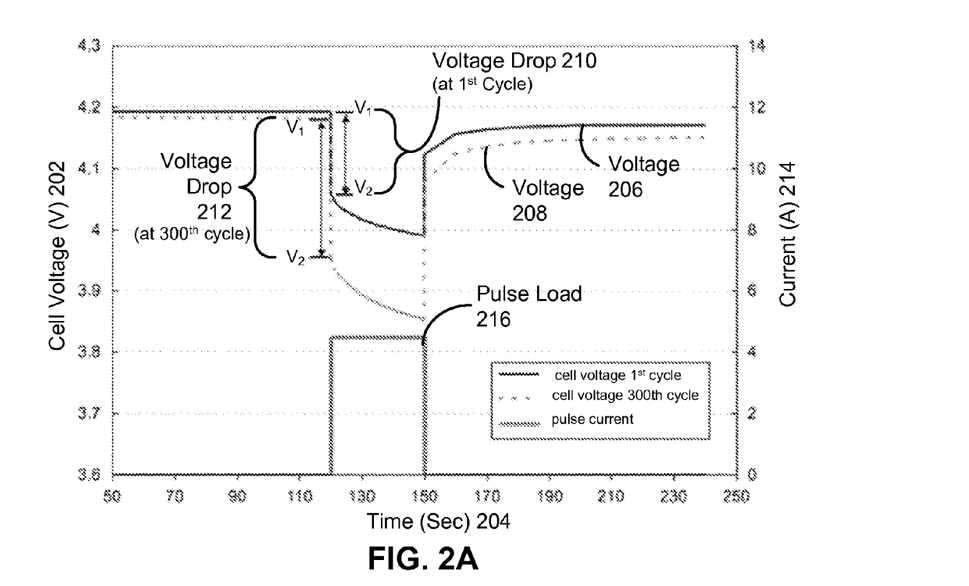
FIG. 2A shows an exemplary plot of battery voltages in accordance with an embodiment.

FIG. 2A shows an exemplary plot of battery voltages 206-208 in accordance with an embodiment. Voltages 206-208 are shown as measurements of volts 202 over time in seconds 204. In addition, each voltage measurement includes a voltage drop 210-212 that is caused by the application of a pulse load 216 to the battery, the current 214 of which is also shown in the plot as a function of time 204.

Voltage 206 may correspond to the voltage measured from the battery during the first charge-discharge cycle of the battery. In other words, voltage 206 may be obtained from a new, un-degraded cell and/or battery. As a result, voltage drop 210 of voltage 206 may be smaller than voltage drops of subsequent voltage measurements (e.g., voltage 208) obtained from the cell and/or battery. In particular, voltage drop 210 may be smaller than voltage drop 212 of voltage 208, which may be measured from the battery during the $300^{th}$ charge-discharge cycle. As shown in FIG. 2A, voltage drop 210 is approximately 0.15 volts, while voltage drop 212 is approximately 0.25 volts, indicating an increase of about 0.1 volts in the voltage drop experienced by the battery during application of pulse load 216 between the first and $300^{th}$ charge-discharge cycle.

As mentioned previously, voltage drops 210-212 may be used to calculate impedances for the battery, which in turn may be used to assess the health of the battery. To determine the impedances, voltage drops 210-212 may be divided by the amount of current 214 applied during pulse load 216. Using a value of 4.5 amps for current 214 of pulse load 216 may produce an impedance of approximately 0.03 ohms during the first charge-discharge cycle of the battery and an impedance of approximately 0.056 ohms during the $300^{th}$ charge-discharge cycle. As discussed below with respect to FIG. 2B, changes in the impedance over time may be used to assess the health of the battery and detect the end-of-life for the battery.

Figure 2B:
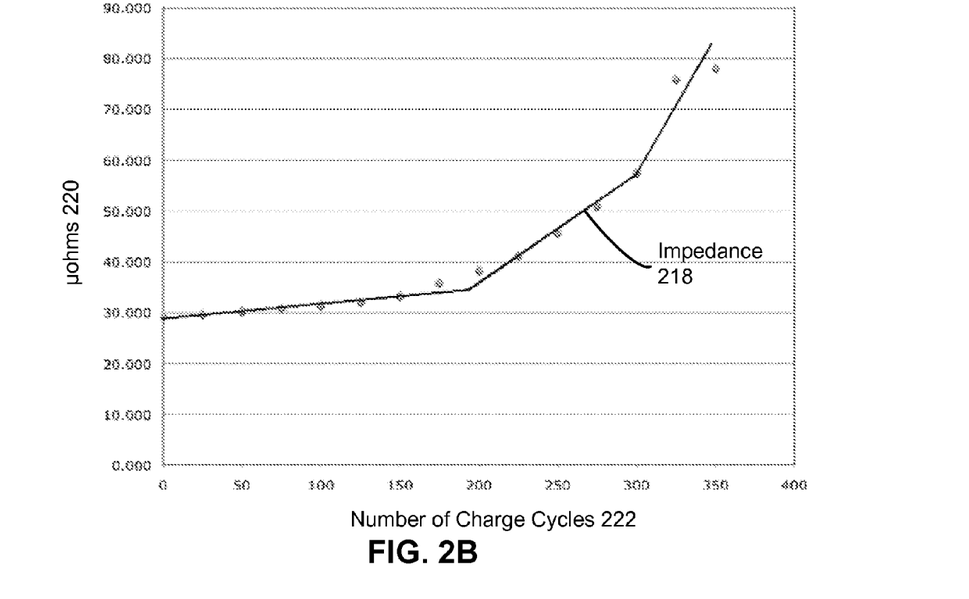
FIG. 2B shows an exemplary plot of impedance for a battery in accordance with an embodiment.

FIG. 2B shows an exemplary plot of impedance 218 for a battery in accordance with an embodiment. Impedance 218 is plotted in μohms 220 as a function of a number of charge-discharge cycles 222 performed on the battery. As described above, impedance 218 may be obtained by measuring the battery's drop in voltage as a pulse load is applied and dividing the drop in voltage by the current of the pulse load.

In one or more embodiments, impedance 218 corresponds to an indicator of health and/or age for the battery. As shown in FIG. 2B, the change in impedance 218 is roughly linear for the first 200 charge-discharge cycles, increasing at a rate of about 25 μohms per charge-discharge cycle. During this period, the battery's capacity may diminish steadily, but the battery may still be in a good state of health. However, after about 200 cycles, the change in impedance increases significantly to about 200 μohms per charge-discharge cycle and progresses linearly for another 100 cycles. The increased change in impedance may represent degradation in the battery and a significant loss in capacity. Finally, at about 300 charge-discharge cycles, the change in impedance 218 increases even more sharply and becomes nonlinear. Once the change in impedance 218 is nonlinear, the end-of-life for the battery may be reached. At this point, the battery may provide little useful charge and may begin to swell if the battery continues to be used.

Consequently, the linearity of impedance 218 as a function of number of charge-discharge cycles 222 may be analyzed to assess the health of the battery and to manage use of the battery. In particular, the charge voltage of the battery may be decreased during the inflection point at around 200 charge-discharge cycles to extend the cycle life of the battery and/or to control cell swelling within the battery. In addition, a notification of end-of-life may be provided and/or charging of the battery may be stopped when the battery reaches 300 charge-discharge cycles to minimize use of the battery after the end-of-life is reached.

Impedance 218 may also be used to detect damage and/or defects in one or more cells of the battery. For example, if a nonlinear increase in impedance 218 is found in a cell prior to 300 charge-discharge cycles, defects and/or damage may be present in the battery. As a result, a notification may be generated and/or the cell may be disconnected from the battery. If all cells of the battery display nonlinear increases in impedance, the battery may be disconnected from the portable electronic device to prevent further use of the battery.

Figure 3:
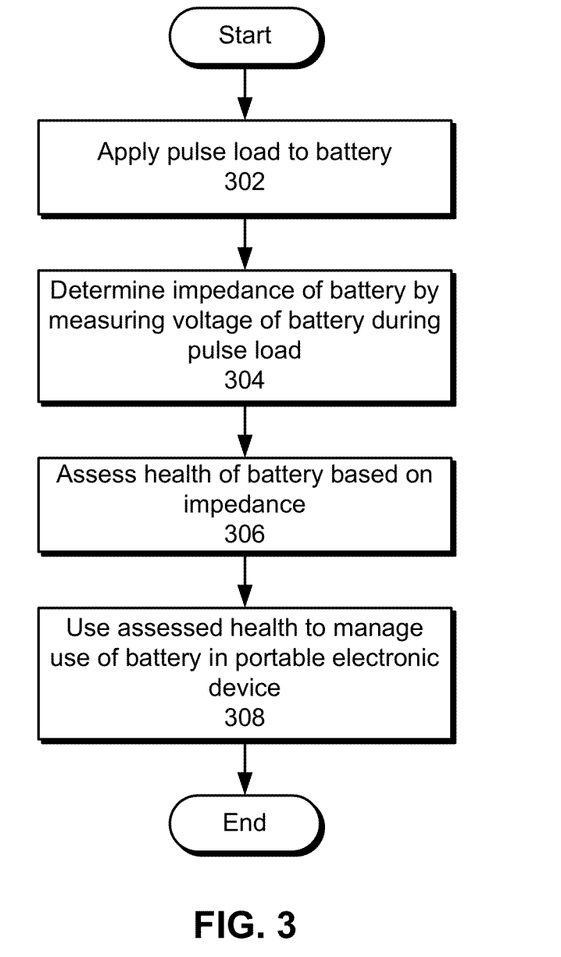
FIG. 3 shows a flowchart illustrating the process of monitoring a battery in a portable electronic device in accordance with an embodiment.

FIG. 3 shows a flowchart illustrating the process of monitoring a battery in a portable electronic device in accordance with an embodiment. In one or more embodiments, one or more of the steps may be omitted, repeated, and/or performed in a different order. Accordingly, the specific arrangement of steps shown in FIG. 3 should not be construed as limiting the scope of the embodiments.

Initially, a pulse load is applied to the battery (operation 302). The pulse load may be generated by an integrated circuit connected to the battery that functions as a load-generating apparatus. For example, the pulse load may be generated by a charger for the battery and may be 0.5 to 10 amps in magnitude and 0.5 to 10 seconds in duration. Next, the impedance of the battery is determined by measuring the voltage of the battery during the pulse load (operation 304). The health of the battery is then assessed based on the impedance (operation 306). As discussed above, the health of the battery may be based on the linearity of the impedance as a function of the number of charge-discharge cycles performed on the battery. Finally, the assessed health is used to manage the use of the battery in the portable electronic device (operation 308). For example, the assessed health may be used to adjust a charge voltage for the battery (e.g., to extend a cycle life of the battery, to control cell swelling within the battery, and/or to stop charging of the battery), notify a user of the portable electronic device of an end-of-life for the battery, and/or isolate a cell in the battery.

Figure 4:
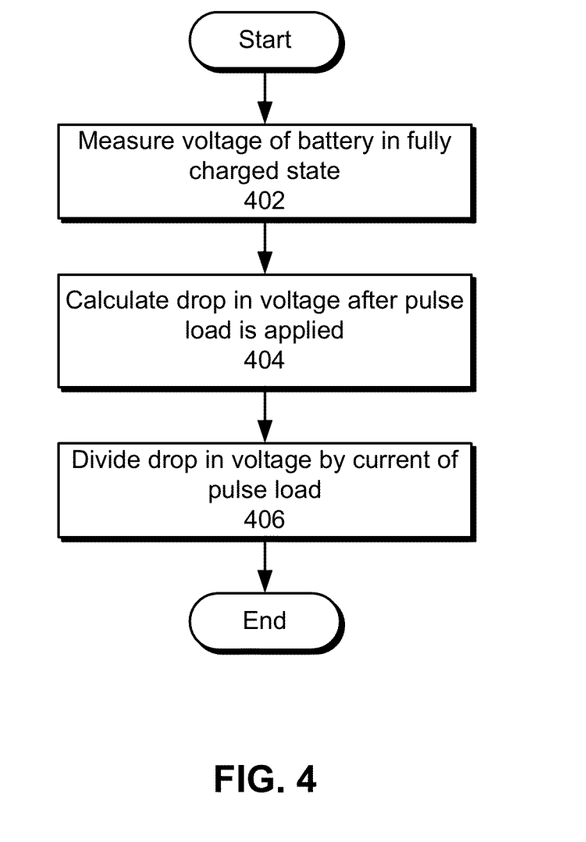
FIG. 4 shows a flowchart illustrating the process of determining the impedance of a battery in accordance with an embodiment.

FIG. 4 shows a flowchart illustrating the process of determining the impedance of a battery in accordance with an embodiment. In one or more embodiments, one or more of the steps may be omitted, repeated, and/or performed in a different order. Accordingly, the specific arrangement of steps shown in FIG. 4 should not be construed as limiting the scope of the embodiments.

First, the voltage of the battery in a fully charged state is measured (operation 402). Next, the drop in voltage after the pulse load is applied is calculated (operation 404). Because the voltage is always measured when the battery is fully charged, changes in the drop in voltage may represent cell oxidation, damage, and/or defects in the battery instead of changes to the battery's state-of-charge. Newer batteries may experience lower drops in voltage than older, defective, and/or damaged batteries. Finally, the drop in voltage is divided by the current of the pulse load (operation 406) to obtain the impedance.

Figure 5:
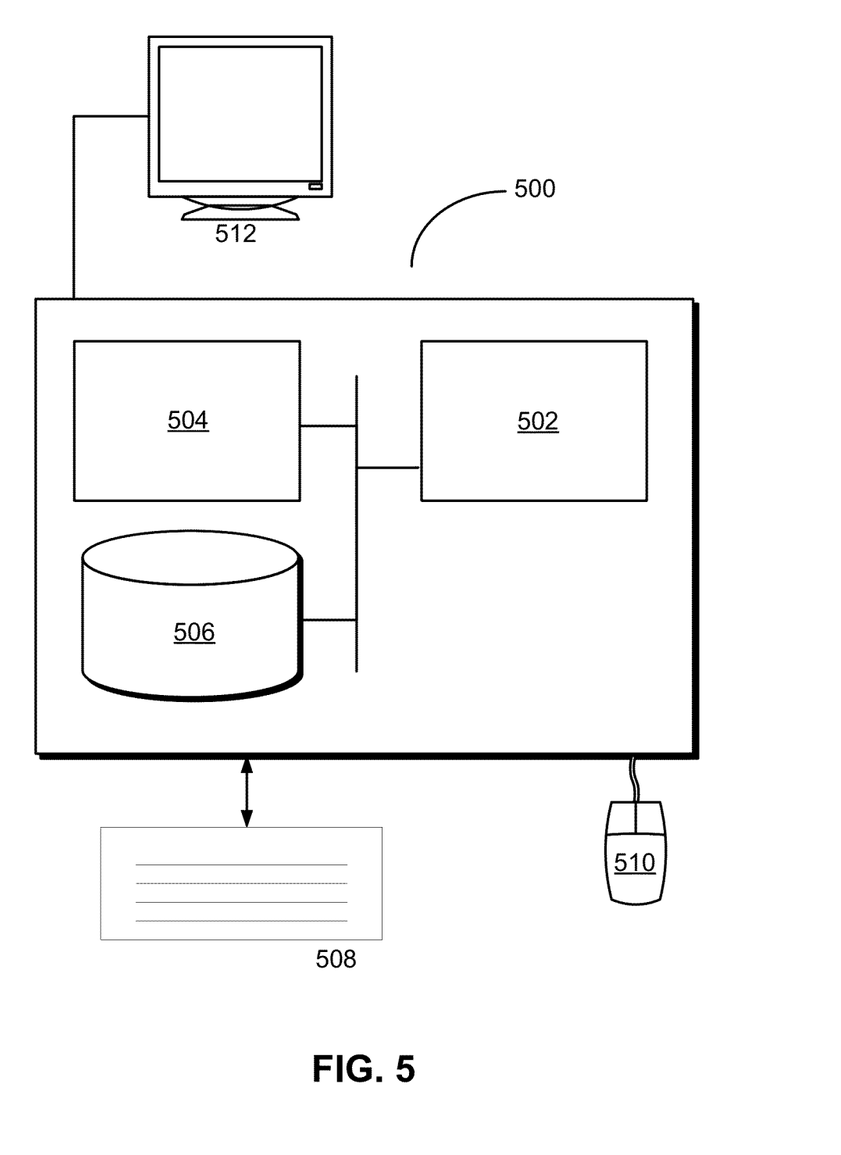
FIG. 5 shows a computer system in accordance with an embodiment.

FIG. 5 shows a computer system 500 in accordance with an embodiment. Computer system 500 includes a processor 502, memory 504, storage 506, and/or other components found in electronic computing devices. Processor 502 may support parallel processing and/or multi-threaded operation with other processors in computer system 500. Computer system 500 may also include input/output (I/O) devices such as a keyboard 508, a mouse 510, and a display 512.

Computer system 500 may include functionality to execute various components of the present embodiments. In particular, computer system 500 may include an operating system (not shown) that coordinates the use of hardware and software resources on computer system 500, as well as one or more applications that perform specialized tasks for the user. To perform tasks for the user, applications may obtain the use of hardware resources on computer system 500 from the operating system, as well as interact with the user through a hardware and/or software framework provided by the operating system.

In one or more embodiments, computer system 500 provides a system for monitoring a battery in a portable electronic device. The system may include a charger that applies a pulse load to the battery. The system may also include a monitoring apparatus that determines an impedance of the battery by measuring a voltage of the battery during the pulse load. Finally, the system may include a management apparatus that assesses a health of the battery based on the impedance and uses the assessed health to manage use of the battery in the portable electronic device. The system may be used to monitor battery health for a battery that supplies charge to computer system 500, or the system may correspond to an external monitoring mechanism for a battery from other portable electronic devices.

In addition, one or more components of computer system 400 may be remotely located and connected to the other components over a network. Portions of the present embodiments (e.g., charger, monitoring apparatus, management apparatus, etc.) may also be located on different nodes of a distributed system that implements the embodiments. For example, the present embodiments may be implemented using a cloud computing system that monitors and manages batteries in remote portable electronic devices.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A system for monitoring a battery in a portable electronic device, comprising:
   a load-generating apparatus configured to apply a pulse load to the battery;
   a monitoring apparatus configured to determine an impedance of the battery by measuring a voltage of the battery during the pulse load; and
   a management apparatus configured to:
      assess a health of the battery based on the impedance by analyzing a linearity of the impedance of the battery for at least two separate charge-discharge cycles performed on the battery; and
      use the assessed health to manage use of the battery in the portable electronic device.

2. The system of claim 1, wherein determining the impedance of the battery involves:
   measuring the voltage of the battery in a fully charged state;
   calculating a drop in the voltage after the pulse load is applied; and
   dividing the drop in the voltage by a current of the pulse load.

3. The system of claim 1, wherein a lack of linearity corresponds to degradation in the battery.

4. The system of claim 1, wherein using the assessed health to manage use of the battery in the portable electronic device involves at least one of:
   adjusting a charge voltage for the battery;
   notifying a user of the portable electronic device of an end-of-life for the battery; and
   isolating a cell in the battery.

5. The system of claim 4, wherein adjusting the charge voltage for the battery involves:
decreasing the charge voltage to extend a cycle life of the battery and to control cell swelling within the battery.

6. The system of claim 4, wherein adjusting the charge voltage for the battery involves:
stopping charging of the battery at the end-of-life for the battery.

7. A portable electronic device, comprising:
a battery;
a set of components powered by the battery;
a charger configured to apply a pulse load to the battery;
a monitoring apparatus configured to determine an impedance of the battery by measuring a voltage of the battery during the pulse load; and
a management apparatus configured to:
assess a health of the battery based on the impedance by analyzing a linearity of the impedance of the battery for at least two separate charge-discharge cycles performed on the battery; and
use the assessed health to manage use of the battery in the portable electronic device.

8. The portable electronic device of claim 7, wherein determining the impedance of the battery involves:
measuring the voltage of the battery in a fully charged state;
calculating a drop in the voltage after the pulse load is applied; and
dividing the drop in the voltage by a current of the pulse load.

9. The portable electronic device of claim 7, wherein a lack of linearity corresponds to degradation in the battery.

10. The portable electronic device of claim 7, wherein using the assessed health to manage use of the battery in the portable electronic device involves at least one of:
adjusting a charge voltage for the battery;
notifying a user of the portable electronic device of an end-of-life for the battery; and
isolating a cell in the battery.

11. The system of claim 10, wherein adjusting the charge voltage for the battery involves:
decreasing the charge voltage to extend a cycle life of the battery and to control cell swelling within the battery.

12. The system of claim 10, wherein adjusting the charge voltage for the battery involves:
stopping charging of the battery at the end-of-life for the battery.

* * * * *